United States Patent [19]
King

[11] Patent Number: 6,081,140
[45] Date of Patent: Jun. 27, 2000

[54] CONTROL CIRCUIT WITH BOTH POSITIVE AND NEGATIVE SENSING

[75] Inventor: Ken Richard King, Lucas, Tex.

[73] Assignee: Texas Instruments, Inc., Dallas, Tex.

[21] Appl. No.: 09/019,661

[22] Filed: Feb. 6, 1998

[51] Int. Cl.[7] .............................. H03K 5/08; H03L 5/00
[52] U.S. Cl. ........................... 327/77; 327/63; 327/66
[58] Field of Search ................................. 327/52, 53, 56, 327/63, 64, 65, 66, 77, 307, 354; 326/52, 54

[56] References Cited

U.S. PATENT DOCUMENTS

| | | | |
|---|---|---|---|
| 4,899,064 | 2/1990 | Neidorff | 307/261 |
| 5,068,620 | 11/1991 | Botti et al. | 330/2 |
| 5,298,809 | 3/1994 | Yamaguchi | 307/491 |
| 5,606,272 | 2/1997 | Behbahani et al. | 327/65 |
| 5,699,010 | 12/1997 | Hatanaka | 327/563 |
| 5,910,736 | 6/1999 | Nagata et al. | 326/126 |

*Primary Examiner*—Toan Tran
*Assistant Examiner*—Anh-Quan Tra

*Attorney, Agent, or Firm*—Gregory M. Howison; Stephen S. Mosher

[57] ABSTRACT

A control circuit is provided which includes a single programmable terminal for controlling a plurality of modes, functions or parameters in a programmable circuit with a minimum of program elements connected to the single programmable terminal. The program elements may illustratively be resistors, capacitors, inductors or other circuit components. In a first mode, for example, two program elements control a signal generating function in the programmable circuit. In a second mode in this example, a voltage provided internally forces a condition at the programmable terminal to control another signal generating function. In both first and second modes, the values of the program elements, selectable by the user, also determine the particular frequencies of the respective generated signals. In a third mode, the signals generated in the first and second modes are compared to provide yet another a control function. There is further provided an absolute value comparator responsive to either polarity of an input sense signal applied to a single sense terminal. A switched output results when the input exceeds a temperature compensated systematic offset inherent to the comparator without requiring external threshold signals.

36 Claims, 5 Drawing Sheets

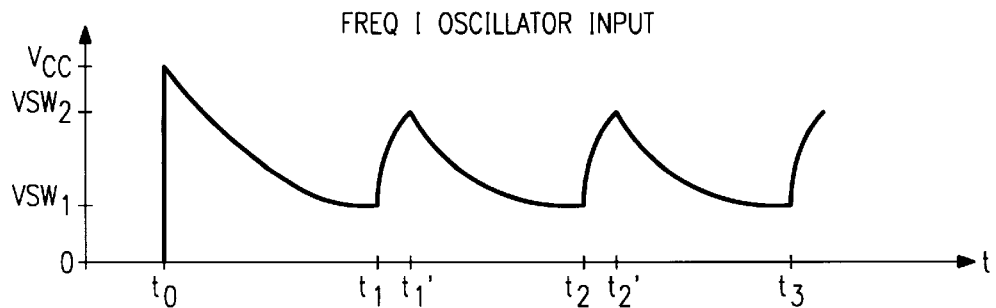
FIG. 4-A
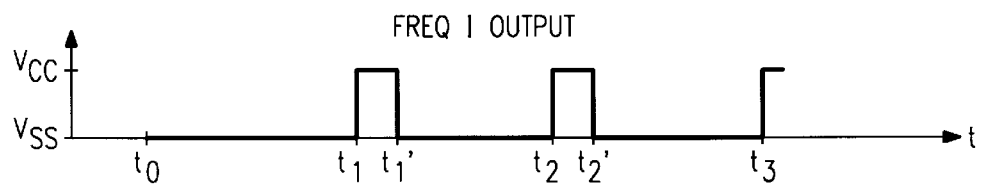
FIG. 4-B
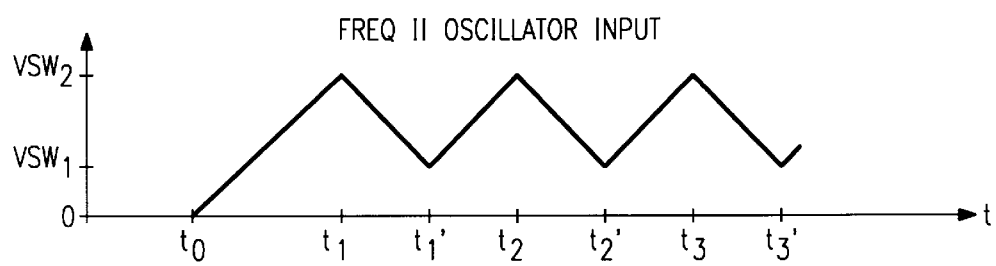
FIG. 4-C
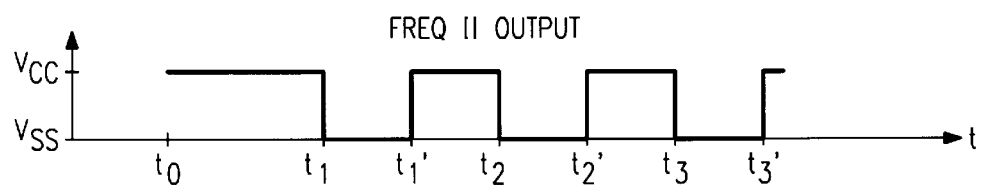
FIG. 4-D
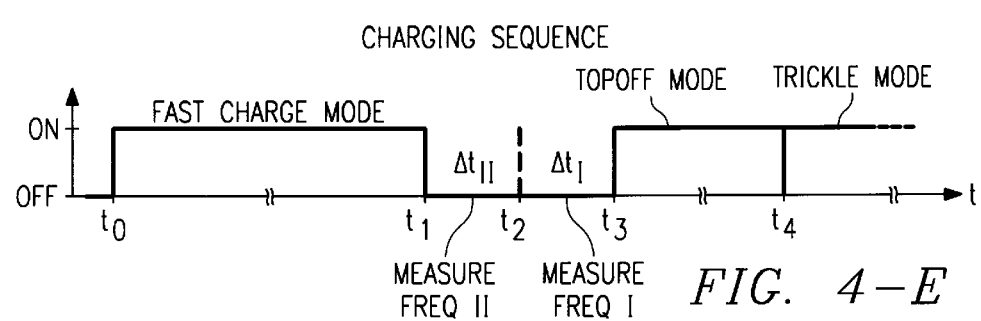
FIG. 4-E

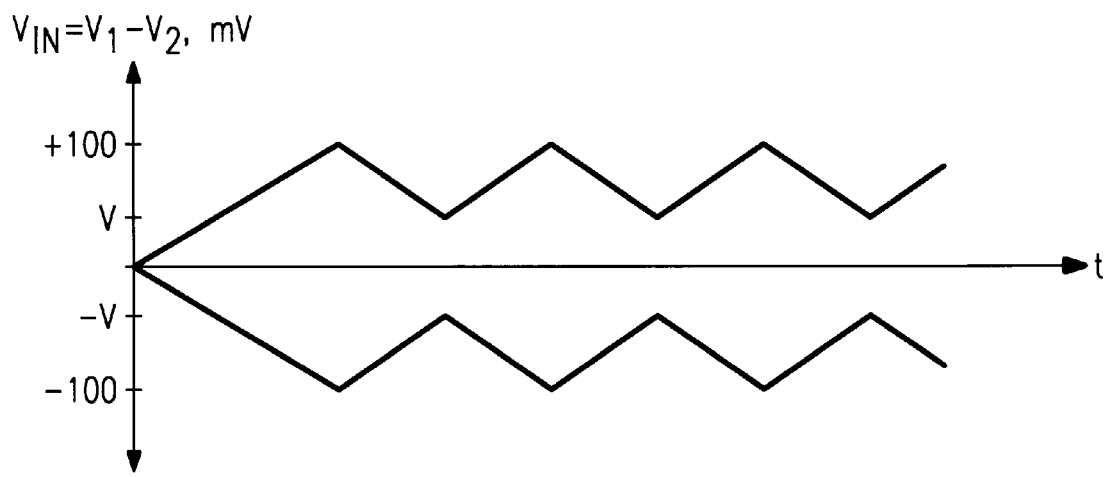
FIG. 6-A
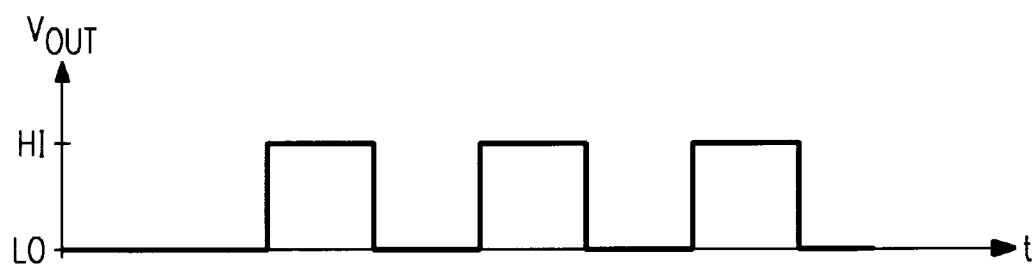
FIG. 6-B
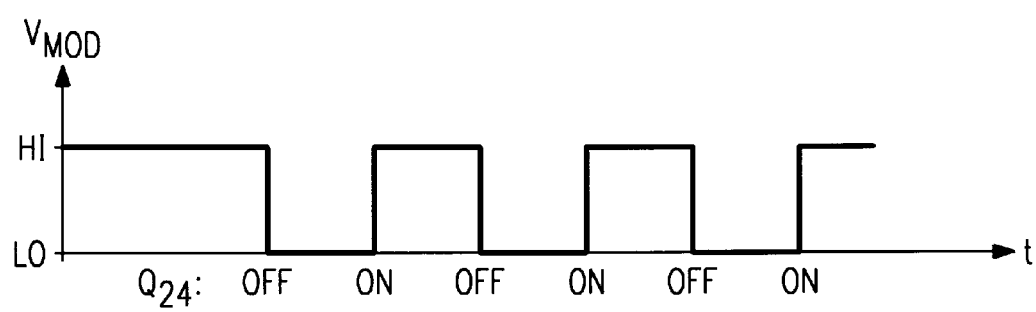
FIG. 6-C

CONTROL CIRCUIT WITH BOTH POSITIVE AND NEGATIVE SENSING

CROSS-REFERENCE TO RELATED APPLICATIONS

This application is related to the concurrently filed U.S. Patent Application entitled "Control Circuit Having Multiple Functions Set by a Single Programmable Terminal," patent application Ser. No. 09/019,662, filed Feb. 6,1998, which is incorporated herein by reference.

TECHNICAL FIELD OF THE INVENTION

The present invention pertains in general to control circuits and, more particularly, to control circuits responsive to either polarity of an input signal at a single terminal.

BACKGROUND OF THE INVENTION

Integrated circuit controllers are widely used in power management applications such as regulated power supplies, battery chargers and the like. The general trend has been to design such circuits to accomplish more of the control functions required in a wider variety of applications to reduce component count and design time, or to provide greater versatility. Product designers are often faced with tradeoffs of desired features with cost objectives.

One problem heretofore unmet in a battery charger application, for example, is providing for control of the timing of a plurality of battery charging modes including fast charge, trickle charge and topoff charge. Various types of battery chemistry and discharge history require different timing of each of these modes to tailor the battery charging operation to a particular type of battery. Typically, several external time references connected to several IC pins may be required to accomplish the desired result.

Another problem found in the exemplary battery charger or other power supply regulator applications is providing a controller that is responsive to both polarities of the load current feedback signal without duplicating sensing circuitry. Typically, this requirement is met by separate amplifiers and references for each polarity which add cost to the system. Further, moving the sense resistor from one lead of the battery to be charged to the other lead ordinarily requires a different circuit design. Alternatively, changing the terminal in the circuit where system ground and chip ground are tied together may also require different circuitry. It would be useful to provide a single controller design with several options for locating the current sense resistor or referencing the control circuit ground in a variety of applications.

Thus, several primary objectives of circuit designers are to provide maximum functionality in a circuit controller without requiring a large number of terminals to interface with input and output components. These goals are typically met in an integrated circuit, for example, by limiting the number of required external components to those that are virtually impossible to fabricate on an integrated circuit. Heretofore, these objectives have been difficult to achieve while accommodating different types of battery charger or regulator circuits.

SUMMARY OF THE INVENTION

The present invention disclosed and claimed herein comprises a control circuit that can be configured to provide a plurality of charging modes by connecting one set of program elements to a single programmable terminal. A programmable circuit is provided within the circuit which generates a timing signal for a first charging mode determined by a pair of selected program elements. The programmable circuit is also operable to generate a second timing signal for a second charging mode determined by one of the selected program elements in combination with another element internal to the control circuit. In both first and second modes, the values of the program elements, selectable by the user, determine the frequencies of the respective generated signals. A voltage provided internally forces a condition at the programmable terminal to control the second charging mode. Further, control of a third charging mode may be effected from a comparison, performed within the control circuit, of the timing signals generated for the first and second charging modes. Thus, three charging modes are controlled by two passive components or program elements connected to a single programmable terminal associated with the control circuit.

In another aspect of the invention, each of the program elements may be resistive or reactive, capacitive or inductive, and may be selected by the user and varied continuously depending on the particular application. In similar fashion, this concept may be generalized to provide for setting or programming other sets of multiple parameters or operating modes in other control applications, particularly where timing or voltage level references are set by external components connected to a programmable terminal.

In a further aspect of the invention a circuit responsive to either positive or negative input sensing at a single sense terminal is provided. A differential comparator within the control circuit is constructed of a single amplifier that is operable without modification with an input sense signal which swings high or low, i.e., in a positive or negative direction. The output of this comparator is coupled to a wired OR circuit which provides an output control signal responsive to the absolute value of the input signal whenever it exceeds a systematic offset internal to the comparator. The systematic offset inherently provides the switching point for both input signal polarities. The comparator thus needs no external reference to set the switching point; it is preset in the comparator. The comparator may also include a temperature compensating bias generator for maintaining circuit stability and assuring a constant systematic offset despite operating temperature variations or manufacturing process variations.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates waveforms associated with the operation of the programmable circuit of FIGS. 2 and 3 and of the battery charger of FIG. 1;

FIG. 6 illustrates waveforms associated with the operation of the programmable circuit of FIG. 5.

DETAILED DESCRIPTION OF THE INVENTION

Figure 1:
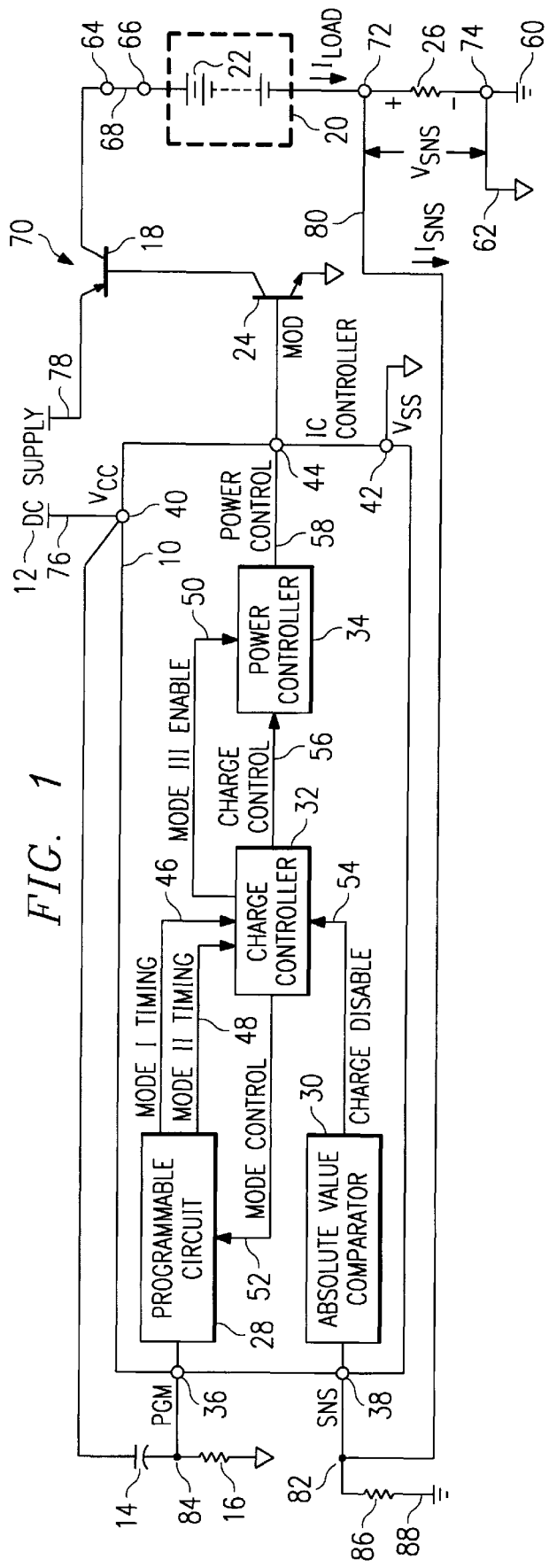
FIG. 1 illustrates a block diagram of an integrated circuit chip system according to the present invention configured as a battery charger.

Referring now to FIG. 1, there is illustrated a block diagram of the integrated circuit chip system. A DC power supply 12 is provided for supplying DC power to a charging circuit via line 78 and an integrated circuit controller ("IC controller") 10 via line 76. Charging circuit 70 includes a PNP bi-polar switching transistor 18 having a base, an emitter and a collector. The emitter of transistor 18 is connected to the power supply 12 via lead 78. A load 20, including for example battery cells 22, is provided having an input and an output. The input is connected to the collector of transistor 18 through terminal 66, jumper 68 and terminal 64. The output of load 20 is connected to system ground 60 through terminal 72, sense resistor 26 and terminal 74. Terminal 74, which is tied to ground 60, may also serve as the common tie point for the controller ground 62 and charger system ground 60. $I_{LOAD}$ designates the load current that flows during battery charging from the collector of transistor 18 through load 20 and sense resistor 26 to ground 62. Connected to the base of transistor 18 is the collector of NPN driver transistor 24. The emitter of transistor 24 is connected to controller ground 62. The base of transistor 24 is coupled to the modulator ("MOD") output 44 of IC controller 10.

Continuing with FIG. 1, DC power supply 12 is connected to the $V_{CC}$ pin 40 of IC controller 10 via line 76. The $V_{SS}$ pin 42 of IC controller 10 is connected to controller ground 62. IC controller 10 is shown having two input pins, the programmable pin ("PGM") 36 and the sensing input pin ("SNS") 38. In the illustrative example shown in FIG. 1, a resistor 16 is connected from the PGM pin 36 to the $V_{SS}$ pin 42, and a capacitor 14 is connected from the PGM pin 36 to the $V_{CC}$ pin 40. Resistor 16 and capacitor 14 are the program elements representative of a variety of combinations that can be used to program the programmable circuit 28 of IC controller 10. Coupled to the SNS pin 38 at node 82 is line 80 connecting the SNS pin 38 to terminal 72 of the sense resistor 26. The sense voltage, $V_{SNS}$, that is developed across sense resistor 26 by the action of $I_{LOAD}$, is coupled via line 80 to resistor 86 and the SNS pin 38. The sense voltage is the input to absolute value comparator 30 of IC controller 10.

Shown within IC controller 10 are several functional circuits arranged to provide a power control signal coupled by line 58 to the MOD pin 44 of IC controller 10. The power control signal controls transistor 24 which serves as the driving circuit for current source transistor 18. PGM pin 36 is the input to programmable circuit 28, which is coupled via two output lines to charge controller 32. One line 46 provides Mode I timing signals and the other line 48 provides Mode II timing signals. Mode I timing signals will be referred to hereinbelow as the fast charge rate, and Mode II timing signals will be referred to as the trickle charge rate. A control line 52 from charge controller 32 to programmable circuit 28 provides for mode control selection of Mode I or Mode II timing signals. SNS pin 38 is the input to absolute value controller 30, which is coupled via an output line 54 to charge controller 32. Line 54 provides a charge disable output signal to charge controller 32 to complete the feedback loop from the load current flowing in sense resistor 26 to charge controller 32. Charge controller 32 provides a charge control output on line 56 to power controller 34. Power controller 34 develops the power control signal on line 58 which is coupled via MOD pin 44 to the base of transistor 24. Charge controller 32 also provides a Mode III enable signal to power controller 34 via line 50. The Mode II enable signal is active when it is desired to provide a topoff charge to load 20.

IC controller 10 may contain numerous other structures and features not necessary for the purposes of the detailed description of the programmable circuit 28 and the absolute value comparator 30 to follow. Other inputs to charge controller 32, for example, may include battery voltage and battery temperature sensor signals. There may also, for example, be one or more outputs from charge controller 32 to indicate charging mode or status of the charging operation. These additional features are for illustration only and not intended to be limiting as to the functionality or operation of the present system.

In operation, charge controller 32 develops three signals for controlling the application of charging current to the load 20 by driver transistor 24 and current source transistor 18. These signals are (1) mode control on line 52, (2) Mode III enable on line 50, and (3) charge control on line 56. These signals are used to select the appropriate charging mode based on the Mode I and Mode II timing signals generated in the programmable circuit 28 and on the load current feedback signal processed by absolute value comparator 30. Using only a single pin, to which are connected two external passive components or program elements, resistor 16 and capacitor 14 in this illustrative example, the programmable circuit generates two distinct timing signals for Mode I (fast charge) and Mode II (trickle charge). These same two signals are utilized by the charge controller 32 to provide the timing information for Mode III (topoff charge). The absolute value comparator 30 also makes use of only a single pin to provide a control output by sensing the load current for either polarity of current flowing in sense resistor 26. The charge disable output signal on line 54 is generated whenever the voltage present at the SNS pin 38 exceeds a built-in switching threshold provided by a systematic offset.

As shown in FIG. 1, the connection of the SNS pin 38 input to the positive end of the sense resistor 26, so that SNS pin 38 is positive with respect to the system ground, is called positive sensing. This will be referred to as Case 1. In some other cases (not shown in FIG. 1), it is advantageous to connect the IC controller ground pin 42 to terminal 72 instead of system ground at terminal 74. Then the sense line 80 is removed. The sense line then connects the negative end (node 74) of sense resistor 26 to the SNS pin 38 input of absolute value comparator 30 through the system ground path. This connection is called negative sensing and will be referred to as Case 2. A variation of Case 1 occurs when the sense resistor 26 is placed in series with the positive lead of the battery, between terminals 64 and 66, replacing jumper 68. The sense voltage across sense resistor 26 in this configuration is easily translated to appear across resistor 86. This is a variation of positive sensing. In either case, whether it is positive or negative sensing, the response of the absolute value comparator 30 is the same. Both positive and negative sense voltage inputs cause the same output result—to disable charge controller 32—when the absolute value of the sense voltage exceeds the systematic offset built into the absolute value comparator 30. This action will be described in greater detail hereinbelow with reference to FIGS. 2 and 5.

The output of charge controller 32 is fed to power controller 34 via charge control line 56. Power controller 34 may be, for example, a comparator responsive to both charge control 56 and Mode III enable 50 signals in providing the power control 58 signal to MOD pin 44. The power control 58 signal, by the action of driver transistor 24, modulates the charging current supplied to the load 20 by current source transistor 18.

Figure 2:
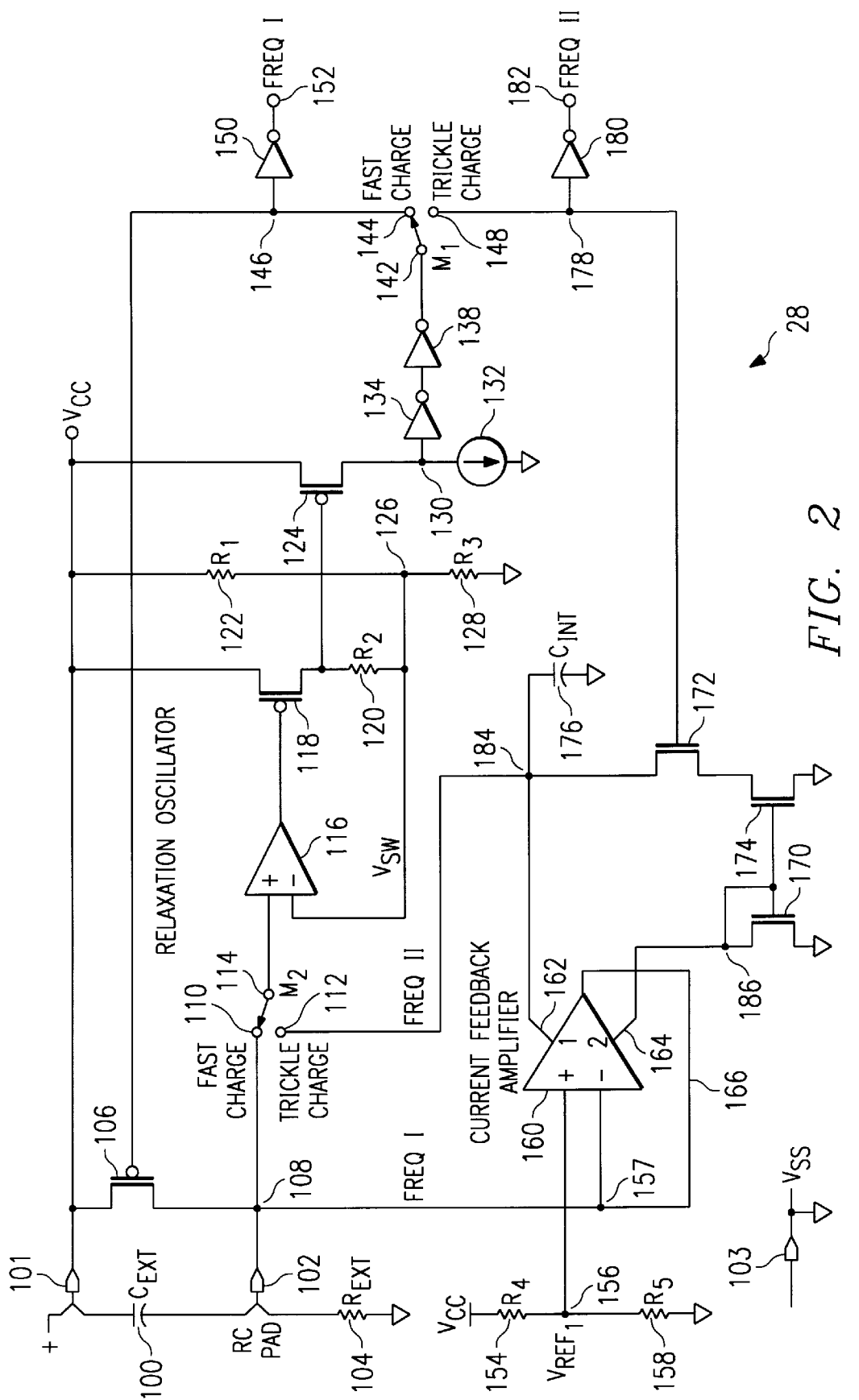
FIG. 2 illustrates a schematic diagram of the programmable circuit portion of the integrated circuit chip system of FIG. 1.

Referring now to FIG. 2, there is illustrated a schematic diagram of the programmable circuit 28 of the present system. An amplifier 116 connected as a relaxation oscillator has a positive input, a negative input and an output. The positive input of amplifier 116 is connected to node 114, the wiper arm of SPDT switch $M_2$. The negative input of amplifier 116 is connected to node 126 at the tap point of a resistor divider comprised of resistors 122 and 128 is connected between positive supply voltage $V_{CC}$ and common return $V_{SS}$. Resistor 122, labeled $R_1$, is connected between $V_{CC}$ and node 126. Resistor 128, labeled $R_3$, is connected between node 126 and $V_{SS}$. Connected across resistor 122 from $V_{CC}$ to node 126 is the source drain path of P-channel transistor 118 in series with a resistor 120, labeled $R_2$. The line connecting node 126 to the negative input of amplifier 116 is the reference bus. The output of amplifier 116 is connected to the gate of P-channel transistor 118. When transistor 118 is OFF, low reference $V_{SW1}$ is determined by the value of $V_{CC}$, which is +5 volts DC in the illustrative example, multiplied by the ratio of resistor 128, $R_3$, to the sum of resistor 122, $R_1$, and resistor 128, $R_3$, ($R_1+R_3$). In this illustrative example, $V_{SW1}$ is set to approximately +1.5 volts. When transistor 118 is ON, high reference $V_{SW2}$ is determined by the value of $V_{CC}$ multiplied by the ratio of resistor 128, $R_3$, to the parallel combination of resistors 122 and 128 summed with resistor 128. In this illustrative example, $V_{SW2}$ is set to approximately +3.75 volts. Thus, the relaxation oscillator operates by using amplifier 116 as a comparator with hysteresis set by the two reference voltages $V_{SW1}$ and $V_{SW2}$ alternately coupled to the negative input of the comparator.

Referring further to FIG. 2, the drain of transistor 118 is also connected to the gate of P-channel transistor 124. The source of transistor 124 is connected to $V_{CC}$. A current sink 132 is connected between the drain of transistor 124 and $V_{SS}$ to function as the load for transistor 124. The drain of transistor 124 is also connected through inverter 134 and inverter 138 connected in series to the wiper of SPDT switch $M_1$ at node 142. It will be appreciated at this point that SPDT switches $M_1$ and $M_2$ may be conventional mux components implemented as part of the integrated circuit of the preferred embodiment. The output signal of relaxation oscillator 116, a logic HIGH or logic LOW signal, coupled through transistor 118, transistor 124, and inverters 134 and 138 to node 142, is connected either to contact 144 or to contact 148 of mux $M_1$. As will be described later, mux $M_1$ and mux $M_2$ are switched in tandem by the mode control signal from charge controller 32 to select the Mode I (fast charge) or the Mode II (trickle charge) charging rate. The circuitry within programmable circuit 28 for controlling mux $M_1$ and mux $M_2$ and other functions associated with switching between Modes I and II are omitted from FIG. 2 for clarity in describing the features and operations of the present system. Contact 144 of mux $M_1$ is connected to the input of inverter 150 at node 146. Inverter 150 functions as a buffer to couple the Mode I signal to terminal 152. The Mode I signal at terminal 152 is referred to as fast charge frequency I. Contact 148 of mux $M_1$ is connected to the input of inverter 180 at node 178. Inverter 180 functions as a buffer to couple the Mode II signal to terminal 182. The Mode II signal at terminal 182 is referred to as trickle charge frequency II. As will be described later, the Mode I and Mode II signals, at nodes 146 and 178 respectively, will be used to control the charging and discharging of the timing capacitors which participate in generating frequency I and frequency II.

Continuing with FIG. 2, the external power supply voltage is connected to positive pad 101 and negative pad 103, respectively. Positive pad 101 supplies $V_{CC}$ to the circuitry within integrated circuit 10 (see FIG. 1). Negative pad 103 connects $V_{SS}$ within integrated circuit 10 to the negative power supply return path. RC pad 102, also referred to as the programmable pin, provides the programmable terminal for connecting external program elements to programmable circuit 28. In the illustrative example of the preferred embodiment, one terminal each of program elements capacitor $C_{EXT}$ 100 and resistor $R_{EXT}$ 104 are connected to programming pin 102. The other terminal of $C_{EXT}$ 100 is connected to $V_{CC}$ at positive pad 101. The other terminal of $R_{EXT}$ 104 is connected to $V_{SS}$ at negative pad 103.

It will be understood by those skilled in the art that various combinations of passive components may be connected between programmable pin 102 and either of positive pad 101 and negative pad 103 to provide the desired timing and mode control. The program elements may be selected, for example, from among resistors, capacitors or inductors. In the illustrative example, an RC time constant has been chosen. As will be shown in detail hereinbelow, resistor 104 and capacitor 100 together determine the repetition rate of frequency I for the fast charge mode of a battery charger utilizing the programmable circuit 28 of the present system. Further, resistor 104 in combination with capacitor 176 within the programmable circuit 28 together determine the repetition rate of frequency II for the trickle charge mode in the illustrative battery charger. Moreover, as will be described hereinbelow, integrated circuit 10 can determine a third operational mode by comparing the values of the external and internal capacitors 100 and 176—by counting the respective cycles of frequency I and frequency II—to determine whether or not a third topoff charging mode needs to be selected. In such a manner, three operating modes of integrated circuit 10 are controlled by program elements connected to a single programmable pin. Moreover, it is important to understand that the two modes specified by Frequency I and Frequency II are each independently and continuously variable merely by selecting the values for resistor 104 and capacitor 100. In principle there are thus an infinite number of possible choices for the timing of the fast charge mode and the trickle charge mode.

Proceeding with FIG. 2, programmable pad 102 is connected to node 108 and contact 110 of mux $M_2$. The source terminal of P-channel transistor 106 is connected to $V_{CC}$ and the drain of transistor 106 is connected to node 108. The gate of transistor 106 is connected to node 146 and contact 144 of mux $M_1$.

The operation of amplifier 116, connected as a relaxation oscillator in generating the fast charge frequency I will now be described. During this description, it will be helpful to refer to FIG. 4-A which illustrates the waveform that appears at node 108. At time $t_0$ in FIG. 4-A, power is applied to the programmable circuit 28. At this instant, the voltage across capacitor 100 is zero volts and the full $V_{CC}$ voltage is impressed across resistor 104. With $V_{CC}$=+5 volts, mux $M_2$ and mux $M_1$ selected for the fast charge mode, and the positive input of amplifier 116 at a logic HIGH, the output of amplifier 116 is HIGH, biasing transistor 118 into an OFF state. Under this condition, resistor 120 is disconnected from the voltage divider used to determine the reference voltage $V_{SW}$ applied to the negative terminal of amplifier 116. This configuration, as described earlier, sets the LOW $V_{SW}$ reference, $V_{SW1}$, to approximately +1.5 volts. With transistor 118 biased OFF by the HIGH output of amplifier 116, the voltage present at the gate of transistor 124 is approximately +1.5 volts because no current flows in resistor 120. This lower voltage will bias transistor 124 into conduction, thus developing a logic HIGH at node 130. This logic HIGH signal, coupled through inverters 134 and 138, appears at node 146 and terminal 152, the output of buffer 150, as a logic LOW. The logic HIGH at node 146 is also coupled to the gate of transistor 106. Transistor 106 is therefore biased in an OFF condition, enabling capacitor 100 to charge toward $V_{SS}$ through resistor 104. This action also decreases the voltage drop across resistor 104 and the voltage present at the positive input of amplifier 116.

As the falling voltage at the positive input of amplifier 116 goes through the reference $V_{SW}$ present at the negative input, the output of the amplifier 116 changes state from HIGH to LOW at time $t_1$. Two events occur as a result. First, transistor 118 turns ON, placing resistor 120 in parallel with resistor 122, thus changing the value of $V_{SW}$ to approximately +3.75 volts by voltage divider action as described previously. Second, as transistor 118 turns ON, transistor 124 is biased OFF and the voltage at node 130 goes LOW. This LOW is also coupled by inverters 134 and 138 to node 146 and the buffer 150 changes state, outputting a logic HIGH at terminal 152. The LOW signal at node 146 is also coupled to the gate of transistor 106, biasing it into conduction and providing a low-resistance discharge path for capacitor 100. The voltage at node 108 thus rises rapidly toward $V_{CC}$ as shown in FIG. 4-A between times $t_1$ and $t_1'$. When the rising voltage at node 108 and the positive input to oscillator 116 equals the +3.75 volt reference $V_{SW2}$ the oscillator again changes state and its output switches HIGH at time $t_1'$. Again, two events occur. Transistor 118 turns OFF and the voltage divider switches the $V_{SW}$ reference back to approximately +1.5 volts. In addition, transistor 124 turns ON resulting in a LOW transition at terminal 152 and a HIGH signal at the gate of transistor 106, removing the discharge path for capacitor 100. Capacitor 100 thus begins charging toward $V_{SS}$ again (from the +3.75 volt level instead of the +5 volt level of $V_{CC}$ as at $t_0$) through resistor 104 and the cycle repeats. Frequency I generated at terminal 152 and shown in FIG. 4-B is thus a periodic pulse train signal switching between $V_{CC}$ and $V_{SS}$ in accordance with the switching of the relaxation oscillator. The amplifier 116 is thus utilized as a comparator with hysteresis to provide the relaxation oscillator funtion. The hysteresis is provided by the two-state voltage divider controlled by transistor 118. The timing of the switching levels is determined by the values selected for capacitor 100 and resistor 104.

Referring again to FIG. 2, the remaining circuitry of the programmable circuit 28 of FIG. 1 for generating the trickle charge Mode II timing, i.e., frequency II, will now be described. Trickle charge Mode II is selected by muxes $M_1$ and $M_2$ being switched in tandem under the control of charge controller 32 shown in FIG. 1 via mode control line 52 to programmable circuit 28. In trickle charge Mode II, contact 142 of mux $M_1$ is connected to contact 148 and contact 114 of mux $M_2$ is connected to contact 112. Contact 148 is connected to node 178. Node 178 is connected to the input of buffer 180 and the gate of N-channel transistor 172. Buffer 180 is an inverter which supplies output frequency II to terminal 182.

The drain of transistor 172 is connected to node 184. The source of transistor 172 is connected to the drain of N-channel transistor 174. The source of transistor 174 is connected to $V_{SS}$. The internal timing capacitor 176 ($C_{INT}$) referred to hereinabove is connected between node 184 and $V_{SS}$. Node 184 is also connected to the positive input of relaxation oscillator 116 via contacts 112 and 114 of mux $M_2$. Further, the drain and gate of N-channel transistor 170 are connected to node 186. The source of transistor 170 is connected to $V_{SS}$. The gate of transistor 170 is connected to the gate of transistor 174. As will be shown, transistor 172 switches on a discharge path for capacitor 176 through the drain-source transconductance of transistor 174. Transistor 174 is continuously biased into conduction by transistor 170 connected in series with a current source output at node 186.

Current feedback amplifier 160 functions essentially as an op amp having a pair of current mirror configured outputs at terminals 162 and 164. Amplifier 160 further includes a conventional output at terminal 166 for providing a voltage output with a substantial drive current. The voltage output at terminal 166 is fed back to the negative input line of amplifier 160 at node 157. Node 157 is also connected to node 108 and to external resistor 104 via programmable pin 102. The positive input to amplifier 160 is connected to node 156. Node 156 is connected to the tap on a voltage divider connected from $V_{CC}$ to $V_{SS}$ within programmable circuit 28. Resistor 154 is connected between $V_{CC}$ and node 156; resistor 158 is connected between node 156 and $V_{SS}$. The voltage available at node 156 is referred to as $V_{ref1}$ and is set in the illustrative example to provide a ratio of 15/40 $V_{CC}$ or about +1.88 volts DC if $V_{CC}$ is +5 volts DC. This reference voltage $V_{REF1}$ determines the value of the voltage available at output terminal 166 of the current feedback amplifier 160, which is applied to programmable pin 102. $V_{REF1}$ is generally chosen at a relatively small voltage to minimize the current that must be supplied by current feedback amplifier 160. On the other hand, $V_{REF1}$ must not be so small that it is below an input threshold of the devices used in the circuit. The ratio 15/40 is a conveniently realizable ratio that meets these criteria.

Figure 3:
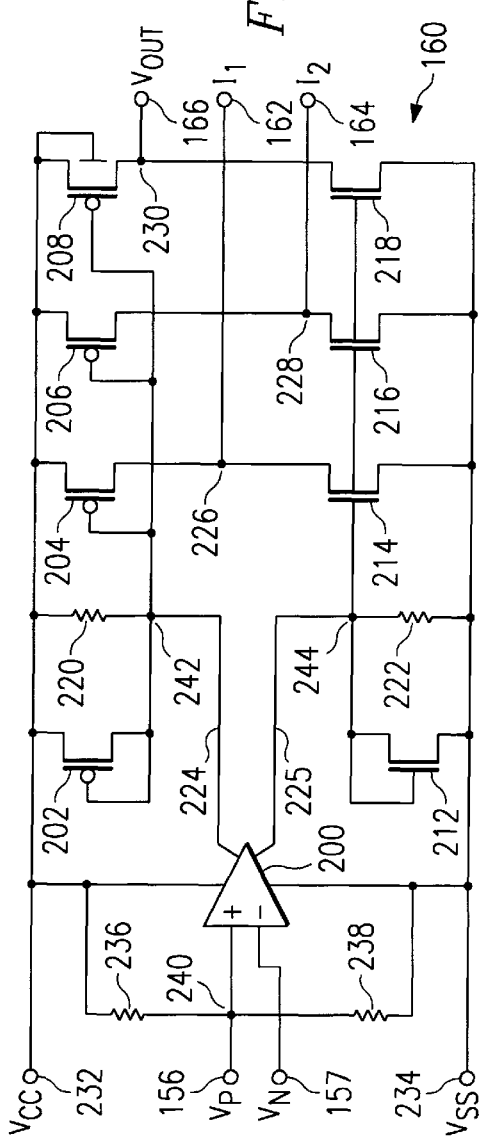
FIG. 3 illustrates a schematic diagram of the differential current amplifier portion of the programmable circuit of FIG. 2.

Before proceeding with a description of the operation of the programmable circuit 28 in generating the trickle charge frequency II, reference is made to FIG. 3. FIG. 3 illustrates a schematic diagram of current feedback amplifier 160 within programmable circuit 28. $V_{CC}$ and $V_{SS}$ are connected, respectively, to nodes 232 and 234. Nodes 156 and 157 represent the positive and negative inputs to differential amplifier 200. Resistor 236 and resistor 238 represent, respectively, the input impedances present at node 240 due to the particular circuit topology which may be employed for differential amplifier 200. The level-shifted outputs 224 and 225 of amplifier 200 are tied through respective active loads to each supply rail, $V_{CC}$ and $V_{SS}$, and to the respective gate terminals of output stage transistors 208 and 218. The positive side active load is represented by P-channel transistor 202 connected in parallel with resistor 220 between $V_{CC}$ and node 242. The negative side active load is similarly represented by N-channel transistor 212 connected in parallel with resistor 222 between node 244 and $V_{SS}$. Nodes 242 and 244 are connected respectively to the level-shifted outputs 224 and 225 of amplifier 200. The source terminal of P-channel transistor 208 is connected to $V_{CC}$, and the source terminal of N-channel transistor 218 is connected to $V_{SS}$. The drains of transistors 208 and 218 are connected together at output node 230. Output node 230 is connected to node 166. The voltage $V_{OUT}$ at node 166 replicates the voltage $V_{REF}$ applied to the positive input, but the output stage comprised of transistors 208 and 218 supply sufficient current capability to drive whatever specified, reasonable value of resistor 104 is connected to programmable pin 102.

The active loads at the output of current feedback amplifier also supply bias for the output transistor pairs 204/214, 206/216 and 208/218 shown in FIG. 3. On the positive side, the gates of P-channel transistors 202, 204, 206 and 208 are tied together to node 242. Similarly, on the negative side, the gates of N-channel transistors 212, 214, 216 and 218 are tied together to node 244. The drain currents of each of transistor pairs 202/212, 204/214, 206/216 and 208/218 are determined by device geometries and bias circuit 201 as is well known in the art. As was mentioned previously, transistor pair 208/218 provides the relatively high current necessary to drive current into external resistor 104. Similarly, transistor pairs 204/214 and 206/216 act as current mirror stages with device parameters adjusted to limit the current available at node 226 and node 228, respectively, to a small fraction of the current available at node 230. The limited current output from node 226 at terminal 162 is used for charging internal capacitor 176 with a linear slope. The current output from node 228 at terminal 164 is used to bias the discharge path for internal capacitor 176 with approximately the same magnitude slope as the charging path. As described hereinbelow, the timing waveform presented to the positive input of oscillator 116 will therefore be approximately a symmetrical triangle waveform.

Referring back to FIG. 2, the generation of the trickle charge frequency II will now be described. During this description, it will be helpful to refer to FIG. 4-C which illustrates the waveform that appears at node 184 and at the positive input to the amplifier 116. Initially, at time to when power is applied to the programmable circuit 28 and the mode control signal from charge controller 32 has set mux $M_1$ and mux $M_2$ to the trickle charge mode, P-channel transistor 106 is biased off because its gate is pulled HIGH by circuitry, not shown in FIG. 2, operated by the mode control signal. Also at $t_Q$, node 184 is at zero volts at the instant capacitor 176 begins to charge toward $V_{CC}$. Node 156 is at approximately +1.88 volts DC as previously described. By action of current feedback amplifier 160, its output 166, node 157, and programmable pin 102 are all at the +1.88 volt DC reference. With transistor 106 OFF, capacitor 100 will charge to the difference between $V_{CC}$ and +1.88 volts. Henceforth, the sense current supplied by current feedback amplifier 160 flows only in resistor 104 in this embodiment because of the constant DC voltage present at programmable pin 102. This current, as described previously, is supplied by the output stage (transistor pair 208/218 in FIG. 3) of current feedback amplifier 160. Through the action of the current mirror output stages (transistor pairs 204/214 for the output at terminal 162 and transistor pairs 206/216 for the output at terminal 164) a small predetermined fraction of the sense current in resistor 104 is supplied to charge capacitor 176 and to control the discharge of capacitor 176. Switching occurs between positive and negative ramps at node 184 as described previously for the relaxation oscillator. The waveform will be triangular in shape because capacitor 176 changes and discharges with a constant current. In this way, the programmable circuit 28 senses whatever value of resistor 104 is used in a particular application. Thus, the value of a single external resistor 104 is used as a term in two different time constants for generating the fast charge and trickle charge frequencies. The value of external capacitor 100 affects the fast charge frequency and, as will be described later, whether or not a topoff node is selected.

The present embodiment is one example of how forcing a condition such as a current or voltage in an external element has been implemented to establish timing and to determine reactive component ratios. However, it is not intended that the technique be limited by the illustrative example described above. On the contrary, various combinations of program elements may be connected to programmable pin 102 to provide a particular time constant or other parameter, with the value of an element sensed by a forced condition, signal, or a sequence of conditions or signals in such element. Several other examples of this technique include but are not limited to forcing a current in an external component or program element and measuring the resulting voltage. Reactive components could be sensed by forcing a time varying current (or voltage) and measuring the resulting time varying voltage (or current). In this way, a plurality of circuit functions may be provided with a minimum of programming pins or external program elements.

Proceeding with the generation of the trickle charge frequency it was stated that node 184 is at zero volts at time $t_Q$. The positive input of amplifier 116 is also at zero volts, and the output of oscillator 116 is LOW. With its gate held LOW by oscillator 116, transistor 118 is ON, and the value of $V_{SW}$ applied to the negative input of amplifier 116 is $V_{SW2}$=+3.75 volts DC. Further, transistor 124 is OFF, and the signal levels at node 130 and node 178 are both LOW. Consequently, the signal level at the frequency II output at terminal 182 is HIGH by the action of inverter 180, and N-channel transistor 172 is biased OFF by the LOW signal present at its gate.

After time $t_Q$, capacitor 176 charges toward $V_{CC}$. As the voltage across capacitor 176 and at the positive input of amplifier 116 reaches +3.75 volts at time $t_1$ in FIG. 4-C, oscillator 116 changes state, and its output switches HIGH. Thus, at time $t_1$, transistor 118 turns OFF, and the $V_{SW}$ line at the negative input to oscillator 116 switches to $V_{SW1}$=+1.5 volts. Transistor 124 turns ON at time $t_1$, and the signal levels at node 130 and node 178 switch to HIGH. Consequently, the output of inverter 180 switches LOW as the first transition of the trickle charge frequency II at terminal 182, as illustrated in the waveform of FIG. 4-D. The other result of the HIGH at node 178 is to turn transistor 172 ON which provides a path for capacitor 176 to discharge through transistor 172 and transistor 174 to $V_{SS}$. The rate of discharge of capacitor 176 will be set by the constant current bias provided at node 170 as previously described. Thus, the voltage across capacitor 176 at node 184 decays toward $V_{SS}$ with a linear slope as illustrated in the waveform of FIGS. 4-C between time $t_1$ and time $t_1'$. Then, at time $t_1'$, when the voltage at node 184 and the positive input to oscillator 116 reaches $V_{SW1}$=+1.5 volts, oscillator 116 again changes state, and the cycle repeats as shown in FIG. 4-C. The resulting output waveform for trickle charge frequency II is shown at FIG. 4-D. It will be seen that this waveform is an approximately symmetrical pulse train or square wave due to the symmetrical and linear charge and discharge characteristics controlled by current feedback amplifier 160. This signal is used by the charge controller 32 to set the pulse width for the trickle charge Mode II. Its frequency is also compared with frequency I to determine whether the topoff charging mode should be selected.

Referring now to FIG. 4-E, the functions of the two frequencies generated by the programmable circuit will now be described. Frequency I, as described herein, is the timing signal used to control the fast charging mode. Similarly, frequency II is the timing signal used to control the trickle charging mode. The pulses contained in these timing signals are counted by circuitry within the charge controller 32 to determine the relationship between these signals. In general, the charging cycle for a particular application will include a particular charging sequence that includes three different modes. The procedures and specifications for charging various types of battery cells are well known in the art and will not be discussed in detail herein. In the present system, the first mode applies a fast charge; that is, full rated charging current is applied for a specified time or until a specified condition, such as voltage across the cell or cells being charged, is achieved. The second mode, which follows a fast charge, applies a trickle charge; that is, rated charging current is applied according to a predetermined duty cycle to replenish charge lost through self-discharge. The duty cycle is adjusted for each cell type. A third mode, which follows the fast charge mode and precedes the trickle charge mode, applies a topoff charge if it is necessary for a particular type of cell. This mode, also referred to as Mode II, will be described in detail hereinbelow.

FIG. 4-E graphically represents a typical charging sequence that includes the three modes described above. Charge controller 32 may include, for example, hardwired logic circuitry for executing the sequence. The charge controller 32 executes the sequence in accordance with the timing signals, frequency I and frequency II, generated by programmable circuit 28, which in turn are set by selecting appropriate values of the external program elements. In the embodiment illustrated hereinabove, fast charge frequency I is set by the value of external resistor 104 and external capacitor 100. Trickle charge frequency II is set by the value of resistor 104 and internal capacitor 176. The topoff mode is set by counting and comparing the pulses of each of frequency I and frequency II to determine whether or not to select topoff charging in a particular sequence. In effect, selecting the topoff mode compares the values of external capacitor 100 and internal capacitor 176. Thus, the user controls the application of the topoff mode by selecting a particular value for external capacitor 100. Moreover, by selecting a value for the two external program elements, resistor 104 and capacitor 100, the user programs three operating modes of the integrated circuit 10 containing the programmable circuit 28. Further, as previously described, two of these operating modes are infinitely variable.

As shown in FIG. 4-E, the charging sequence begins with the fast charge mode at time to. It should be recalled that the fast charge mode is controlled by the pulse train of frequency I, illustrated in FIG. 4-B. During the fast charge mode, the charge controller 32 counts each cycle of the pulse train of frequency I until a predetermined count is accumulated. Upon reaching that count value, the fast charge mode is terminated. Thus, the pulse train of frequency I in effect sets the maximum permissible fast charge duration for the cell or cells being charged. Upon completion of charging at time $t_1$, typically after several hours, the fast charge mode ends and charging action is interrupted while charge controller 32 (shown in FIG. 1) activates the programmable circuit 28 first in Mode II and then in Mode I while charge controller 32 counts the pulses of frequencies I and II during identical separate respective intervals between time $t_1$ and time $t_3$. These intervals are designated $\Delta t_{II}$ and $\Delta t_I$. For example, $\Delta t_I = \Delta t_{II}$ which may be equal to one second. If the number of pulses counted for frequency II exceeds the number of pulses counted for frequency I; that is, if the external capacitor 100 is larger than some multiple of the internal capacitor 176, then topoff mode is selected to begin at time $t_3$ and ends after a predetermined time at time $t_4$. On the other hand, if the number of pulses counted for frequency II is equal to or is exceeded by the number of pulses counted for frequency I; that is, if the external capacitor 100 is smaller than some multiple of the internal capacitor 176, then the topoff mode is not selected, and operation enters the trickle charge mode beginning at time $t_4$. The system remains in trickle charge mode until the end of the charging sequence. It is to be understood that, by choosing the relative magnitudes of the external element values, a designer can set up a particular comparison result in a particular application.

There are various means available to count the pulses of frequencies I and II. By way of illustration only, a storage register (not shown) within charge controller 32 of FIG. 1 may be configured to accumulate a count for each pulse of the first frequency received at its input during the fixed interval at. The controller 32 then decrements the accumulated count by one count for each pulse at the second frequency received at its input during another identical interval $\Delta t$. If, at the end of the second interval $\Delta t$, one or more counts remains in the register, as in the first example above, the first frequency count exceeds the second and the topoff mode would be selected. Similarly, if at the end of the second interval $\Delta t$, zero counts remain in the register, as in the second example above, the first frequency count does not exceed the second and the topoff mode would not be selected.

Figure 5:
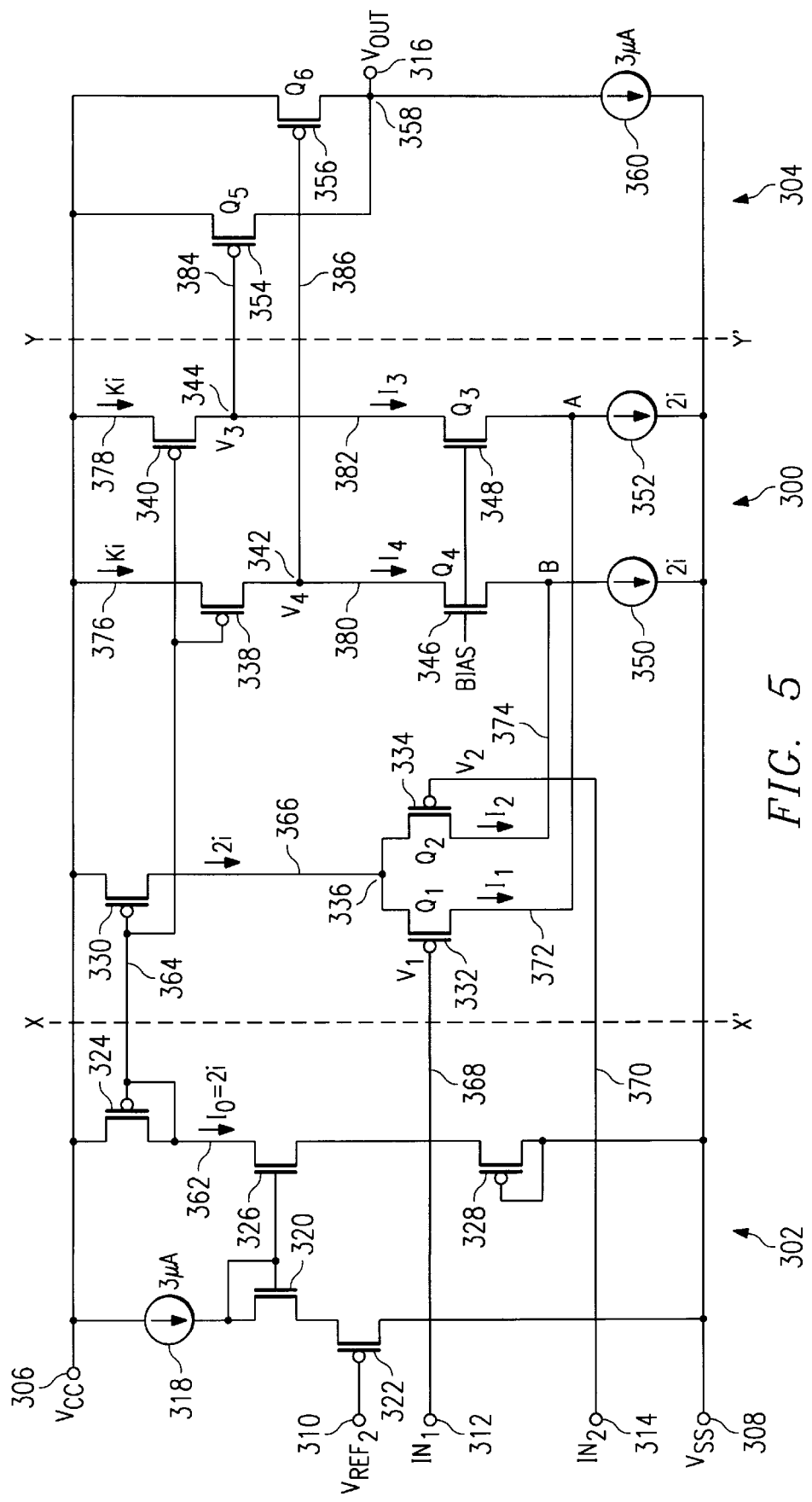
FIG. 5 illustrates a schematic diagram of the absolute value comparator portion of the integrated circuit of FIG. 1.

Referring now to FIG. 5, the absolute value comparator 30 portion of the IC controller 10, shown in block diagram form in FIG. 1, will now be described. FIG. 5 illustrates a schematic diagram of an absolute value comparator 30 according to the present system. In FIG. 5, there is a circuit having three sections. The section to the left of dashed line X–X' is bias generator 302. This section also includes input terminals to the circuit of absolute value comparator 30. The section between dashed line X–X' and dashed line Y–Y' is a differential comparator 300 having a systematic offset to be described hereinafter. The section to the right of dashed line Y–Y' is a wired OR circuit 304 for providing the absolute value function. Operating voltage $V_{CC}$ is applied to terminal 306. The $V_{SS}$ or common return is represented by terminal 308. $In_1$, at terminal 312, is connected via path 368 to the gate of P-channel transistor 332, an input of the differential stage of comparator 300. $In_2$, at terminal 314, is connected via path 370 to the gate of P-channel transistor 334, the other input of the differential stage of comparator 300.

Referring further to FIG. 5, bias generator 302 will now be described. $V_{REF2}$ is a reference voltage applied to terminal 310 which is further connected to the gate of P-channel transistor 322. Connected from $V_{CC}$ to $V_{SS}$, in the following order, are current source 318 biased for three microamperes, the drain-source path of N-channel transistor 320, and the source-drain path respectively of P-channel transistor 322. The drain and gate of transistor 320 are connected together. Also connected from $V_{CC}$ to $V_{SS}$, in order, are the source-drain path of P-channel transistor 324, the drain-source path of N-channel transistor 326, and the source-drain path of P-channel transistor 328. The gate and drain of transistor 324 are connected together. The gates of N-channel transistors 320 and 326 are connected together. The gate and drain of transistor 328 are connected together. The gate and drain of transistor 324 are also connected to biasing line 364 which is further connected to the gates of P-channel transistors 330, 338 and 340.

In operation, reference voltage $V_{ref2}$ at terminal 310 in combination with current source 318 provides the bias necessary to establish a voltage at the common gate terminals of N-channel transistors 320 and 326. This bias voltage establishes biasing current $I_0$ at a value of 21 in path 362 connecting the drains of P-channel transistor 324 and N-channel transistor 326. This value of biasing current $I_0$ is reflected by current mirror action via biasing line 364 into the common path for the differential input stage of comparator 300.

The differential comparator 300 illustrated in FIG. 5 includes three circuit branches, each branch connected from $V_{CC}$ to $V_{SS}$. In the first branch, starting from the left in FIG. 5, the source of P-channel transistor 330 is connected to $V_{CC}$. The drain of transistor 330 is connected to both source terminals of the differential input pair of P-channel transistors 332 and 334 at node 336. The drain of transistor 332 is connected via path 372 to node A. Node A is connected to $V_{SS}$ via current source 352. Similarly, the drain of transistor 334 is connected via path 374 to node B. Node B is connected to $V_{SS}$ via current source 350. Current sources 350 and 352 are both set to a value of 2I by biasing circuitry similar to that already described but not shown for clarity. Since biasing current $I_0$ is equal to the value 2I flowing in path 366, currents $I_1$ and $I_2$, in each output leg of the differential pair of transistors 332 and 334, are each equal to one-half the value 2I when the input voltages $V_1$ and $V_2$ respectively, at the gate terminals of transistors 332 and 334 are equal. In other words, $I_1=I_2=I$. This condition just described represents the quiescent state when no input, i.e., $V_1-V_2=0$, is present at input terminals 312 and 314.

The next branch connected from $V_{CC}$ to $V_{SS}$ in FIG. 5 begins with P-channel transistor 338 connected as a current source to supply a current value of k×I in this branch. The factor k will be described hereinbelow. The gate of transistor 338 is connected to biasing line 364. The source of P-channel transistor 338 is connected to $V_{CC}$. The drain of transistor 338 is connected to node 342. Node 342 is connected to the drain of N-channel transistor 346 via path 380. The source of transistor 346 is connected to node B. $I_4$, the current in transistor 346, is set to a quiescent value equal to I when $V_1-V_2=0$ by bias circuitry connected to the gate of transistor 346. Notice that under this condition $I_2=I$ and $I_4=I$, and $I_2+I_4=2I$ at the summing point at node B. This sum of $I_2$ and $I_4$ is the same as the output of current source 350.

The next branch connected from $V_{CC}$ to $V_{SS}$ in FIG. 5 is structurally similar to the previous branch because it forms the other output leg of differential comparator 300. It begins with P-channel transistor 340 connected as a current source to supply a current value of k×I in this branch. This is the same factor k referred to in the previous paragraph. The gate of transistor 340 is also connected to biasing line 364. The source of transistor 340 is connected to $V_{CC}$. The drain of transistor 340 is connected to node 344. Node 344 is connected to the drain of N-channel transistor 348 via path 382. The source of transistor 348 is connected to node A. $I_3$, the current in transistor 348, is also set at a quiescent value equal to I because of conditions at node A. The gates of transistors 346 and 348 are connected together. Notice here also that $I_1=I$ and $I_3=I$, and $I_1+I_3=2I$ at the summing point at node A. This sum of $I_1$ and $I_3$ is the same as the output of current source 352.

Referring again to FIG. 5, the remaining circuitry to the right of dashed line Y–Y', the wired OR output 304, will now be described. The source of P-channel transistor 354 is connected to $V_{CC}$. The gate of transistor 354 is connected to node 344 via path 384 from the drain (output terminal) of P-channel transistor 340. The drain of transistor 354 is connected to node 358. The source of P-channel transistor 356 is connected to $V_{CC}$. The gate of transistor 356 is connected to node 342 via path 386 from the drain (output terminal) of P-channel transistor 338. The drain of transistor 356 is also connected to node 358. Node 358 is connected through current source 360 to $V_{SS}$. Current source 360 is biased at a current of three microamperes by circuitry similar to the biasing for current source 318 described hereinabove. Node 358 is further connected to terminal 316, the output terminal of the absolute value comparator. Node 316 supplies the charge disable output along line 54 as shown in FIG. 1.

Before proceeding with the operation of the absolute value comparator with systematic offset illustrated in FIG. 5, the mechanism for providing the systematic offset will be briefly described. The systematic offset is a predetermined threshold designed into the comparator circuit of the present system. The systematic offset enables a consistent, accurate switching level, which is stable despite process variations in manufacturing or temperature variations during operation, for controlling illustratively, a switching regulator power supply or other circuit function. Switching regulators are used in a wide variety of power supply applications, including but not limited to battery charging. Details of the systematic offset will become clear as the description proceeds.

Referring further to FIG. 5, it will be noted that P-channel transistors 324, 330, 338 and 340 are all biased by the same voltage on biasing line 364 that is established by bias generator 302. As a result, if transistors 314, 330, 338 and 340 are identical devices, the currents in each of the drain circuits will also be identical, as is well known to persons skilled in the integrated circuit arts. However, a property of such circuits is that if the current handling capability of the output transistors 338 and 340, which are connected as current sources operating as active loads in the differential comparator 300 illustrated in FIG. 5, is modified by changing the W/L ratio for these devices, the comparator can be made to switch the output at a predetermined point just as if there was a fixed external reference connected to one of the input terminals. As understood by those skilled in the art, the W/L ratio, which represents the ratio of MOS transistor channel width-to-length, directly affects the drain current the device may conduct when the device is biased as a current source. This is because of the well known relations:

$$gm(N \text{ Channel}) = \frac{(W/L)}{40} \Delta V \text{ millimhos} \quad (1)$$

and $$gm(P \text{ Channel}) = \frac{(W/L)}{150} \Delta V \text{ millimhos} \quad (2)$$

for the transconductance of MOS transistors, where $\Delta V=V_{GS}-V_{TH}$. $V_{GS}$ represents the gate-source ON voltage external to the transistor and $V_{TH}$ represent the threshold voltage of the MOS transistor necessary to cause current to flow.

By changing the W/L ratio, the current levels of the current sources comprising transistors 338 and 340 may be scaled to a value k×I, wherein 0<k<2. The effect of scaling ratio k is to provide, in a systematic way, a predetermined offset voltage which must be overcome by the input signal to cause the output of the comparator to change state. To see how this effect operates, the operation of the absolute value comparator with systematic offset of the present system will now be described.

Initially, in the circuit illustrated in FIG. 5, several parameters meet the following conditions: $V_1$ at the gate of transistor 332 is equal to $V_2$ at the gate of transistor 334 and $V_2$ may be connected, as in this example, to $V_{SS}$. Transistor 332, labeled $Q_1$, and transistor 334, labeled $Q_2$, are conducting equal currents, so $I_1$, the drain current of $Q_1$, is equal to $I_2$, the drain current of $Q_2$. Also, $I_1=I_2=I$, which is one-half the value of the reference bias current, 2I. Similarly, transistor 348, labeled $Q_3$, and transistor 346, labeled $Q_4$, are conducting equal currents, so $I_3$, the drain current of $Q_3$, is equal to $I_4$, the drain current of $Q_4$. Likewise, $I_3=I_4=I$. Under these conditions, $V_3$ at node 344 and $V_4$ at node 342 are also equal as determined by the scaling ratio k, and are close enough to $V_{CC}$ that transistor 354, labeled $Q_5$, and transistor 356, labeled $Q_6$, are biased OFF. This is because the currents in transistors 338 and 340 are respectively greater than the currents $I_4$ and $I_3$, by the scaling ratio k. The result is that node 358 is LOW and $V_{OUT}$ is also LOW, i.e., near $V_{SS}$.

When either $I_1$ or $I_2$ decreases, because $V_1$ has increased or decreased, respectively, then $I_3$ or $I_4$ must increase to maintain the summing condition at node A or node B, respectively. Further, when $I_1$ or $I_2$ decreases far enough so that $I_3$ or $I_4$, respectively, becomes equal to k×I, then the condition for switching (i.e., the value of the systematic offset which, in this illustrative example, is set to 100 mV, referred to the input, for a scaling ration of approximately 1.75) is reached, and the voltage at node 344 ($V_3$) or 342 ($V_4$) begins to fall from its value corresponding to the current k×I. Consequently, $Q_5$ or $Q_6$ turns ON, raising $V_{OUT}$ from a LOW level to a HIGH level. Notice that, since $V_3$ and $V_4$ are respectively set to bias $Q_5$ and $Q_6$ in an OFF condition, $V_3$ and $V_4$ establish a maximum positive threshold voltage in this circuit. A more positive $V_3$ and $V_4$ has no effect, corresponding to input sensing voltages below the systematic offset threshold. On the other hand, a more negative $V_3$ and $V_4$ causes $Q_5$ or $Q_6$ to turn ON and the output level $V_{OUT}$ 316 changes state as the input sensing voltage exceeds the systematic offset threshold.

$Q_5$ and $Q_6$ together form a wired OR circuit with their respective inputs connected to the output nodes 344 and 342 of the two legs of the differential comparator. Since the outputs of $Q_5$ and $Q_6$ are connected together, and both $Q_5$ and $Q_6$ are biased OFF except when an input is present at either node 344 or node 342, the output represents a logic OR. The logic OR function provides a switched output if the sensed voltage at the input exceeds the systematic offset in either direction or polarity. Therefore, the output of the comparator represents the absolute value of the input. This action described in the above paragraph is illustrated in the waveforms of FIG. 6-A and FIG. 6-B. Notice that as $V_{IN}$ rises in either direction, $V_{OUT}$, the charge disable output, remains LOW until $V_{IN}$ reaches the 100 mV systematic offset, at which point $V_{OUT}$ switches HIGH. $V_{OUT}$ will remain HIGH until reset by other conditions in the switching regulator circuit, outside of and unrelated to the absolute value comparator. The reset point is represented as occurring at V and −V in FIG. 6-A.

The waveform of $V_{OUT}$ is coupled as a charge disable output signal on line 54 to charge controller 32 as illustrated in FIG. 1. The effect of the absolute value comparator 30, which senses the current in resistor 26 in FIG. 1, is to provide a feedback control signal responsive to the load current delivered by transistor 18 to battery cells 22. The waveform which controls driver transistor 24 ($Q_{24}$) is $V_{MOD}$ shown in FIG. 6-C with timing along the horizontal axis corresponding to FIG. 6-B.

In summary, there has been provided a control circuit which includes a single programmable terminal for controlling a plurality of modes, functions or parameters in a programmable circuit with a minimum of external program elements connected to the single programmable terminal. The program elements may illustratively be any combination of resistors, capacitors, inductors or other circuit components. In one mode, for example, two selected program elements control a signal generating function in the programmable circuit. In another mode, a voltage provided internally forces a condition at the programmable terminal to control another signal generating function. In a third mode, the signals generated in the first and second modes are compared to provide yet another control function. All three modes as well as the particular frequencies in two of these modes, are determined by the same two selected program elements. There is further provided an absolute value comparator responsive to either polarity of an input sense signal applied to a single sense terminal. The switched output results when the input exceeds a temperature compensated systematic offset inherent to the comparator without requiring external threshold signals.

Although the preferred embodiment has been described in detail, it should be understood that various changes, substitutions and alterations can be made therein without departing from the spirit and scope of the invention as defined by the appended claims.

What is claimed is:

1. A control circuit, comprising:
   a comparator, having an input and having a control output circuit operative in a first state or a second state;
   a sense input for coupling a sense signal of positive or negative polarity to said comparator;
   wherein said control output circuit changes between said first state and second state whenever the absolute value of said sense signal exceeds a systematic offset associated with the operation of said comparator; and
   a bias generator, for generating a bias value for defining said systematic offset, configured of at least one semiconductor device occupying a unit area of a substrate.

2. The control circuit of claim 1, wherein said control output circuit comprises a logical OR function.

3. The control circuit of claim 1, wherein said bias generator comprises a current source coupled to a reference voltage.

4. The control circuit of claim 1, wherein said comparator comprises first and second active loads, configured according to a scaling ratio for relating the device area of said active loads to said unit area, for providing first and second outputs to said control output circuit.

5. The control circuit of claim 4, wherein said scaling ratio comprises the semiconductor device area of said active load divided by said unit area.

6. The control circuit of claim 5, wherein said systematic offset is defined for a value of said scaling ratio between zero and two.

7. The control circuit of claim 6 implemented as an integrated circuit.

8. A comparator, comprising:
   a comparator circuit coupled with a bias generator for generating a bias value and said bias generator configured of at least one semiconductor device occupying a unit area of a substrate, and said comparator circuit having a first input coupled to a sense signal of a positive or negative polarity and a second input coupled to a first reference; and
   an output circuit providing a control output when the absolute value of said sense signal exceeds a systematic offset associated with the operation of said comparator circuit defined in relation to said bias value.

9. The comparator of claim 8, wherein said bias generator comprises a current source coupled to a second reference.

10. A comparator, comprising:
    a comparator circuit having a first input coupled to a sense signal of a positive or negative polarity and a second input coupled to a first reference; and
    an output circuit providing a control output when the absolute value of said sense signal exceeds a systematic offset associated with the operation of said comparator circuit;

wherein said comparator circuit comprises first and second active loads, configured according to a scaling ratio for relating the device area of said active loads to said unit area, for providing first and second outputs to said output circuit.

11. The comparator of claim 10, wherein said scaling ratio comprises the semiconductor device area of said active load divided by said unit area.

12. The comparator of claim 11, wherein said systematic offset is defined for a value of said scaling ratio between zero and two.

13. The comparator of claim 12, wherein said systematic offset exceeds ten millivolts.

14. The comparator of claim 12, wherein said systematic offset is less than or equal to 10 millivolts.

15. The comparator of claim 8, wherein said output circuit comprises a logical OR function which changes state whenever the absolute value of said sense signal exceeds said systematic offset.

16. The comparator of claim 15, wherein said systematic offset corresponds to a predetermined input offset voltage for an input differential amplifier.

17. The comparator of claim 12 implemented as an integrated circuit.

18. A comparator having first and second inputs and first and second outputs, comprising:
   a bias generator for generating a bias value for operating the comparator, configured of at least one semiconductor device occupying a unit area of a substrate;
   an input signal of positive or negative polarity coupled to one of said first and second inputs, the other of said first and second inputs being coupled to a reference;
   a systematic offset defined in relation to said bias value; and
   a logical OR circuit coupled to said first and second outputs wherein said OR circuit changes state when the absolute value of said input signal exceeds said systematic offset.

19. The comparator of claim 18, wherein said comparator comprises first and second active loads, configured according to a scaling ratio for relating the device area of said active loads to said unit area, to provide, respectively, said first and second outputs.

20. The comparator of claim 19, wherein said scaling ratio comprises the semiconductor device area of each of said active loads divided by said unit area.

21. The comparator of claim 20, wherein said systematic offset is defined for a value of said scaling ratio between zero and two.

22. The comparator of claim 21 implemented as an integrated circuit.

23. In a current supply providing an output current, apparatus comprising:
   a comparator having first and second inputs, a systematic offset and first and second outputs;
   a single sense terminal for coupling a sense signal comprising the voltage across a sense resistor connected in series with said output current of positive or negative polarity to one of said first and second inputs; and
   a wired-OR circuit coupled to said first and second outputs, and having a control output for controlling said current supply;
   wherein the other of said first and second inputs is coupled to a reference, and said control output is disabled when the absolute value of said sense signal exceeds said systematic offset.

24. In a current supply providing an output current, apparatus comprising:
   a comparator having first and second inputs, a systematic offset and first and second outputs;
   a single sense terminal for coupling a sense signal of positive or negative polarity to one of said first and second inputs;
   a wired-OR circuit coupled to said first and second outputs, and having a control output for controlling said current supply;
   wherein the other of said first and second inputs is coupled to a reference, and said control output is disabled when the absolute value of said sense signal exceeds said systematic offset; and
   wherein said comparator includes a temperature compensating bias generator defined by a bias device occupying a unit area of a semiconductor substrate.

25. The circuit of claim 24, wherein said comparator comprises first and second active loads, configured according to a scaling ratio for relating the device area of said active loads to said unit area, to provide respectively said first and second outputs wherein said scaling ratio comprises the device area of said active load divided by said unit area.

26. The circuit of claim 25, wherein said systematic offset is defined for a scaling ratio value between zero and two.

27. The circuit of claim 23, wherein said output current is disabled when said control output is active and enabled when said control output is not active.

28. The circuit of claim 23, wherein said output current is enabled when said control output is enabled when said control output is active and is disabled when said control output is not active.

29. The circuit of claim 24, wherein said temperature compensating bias generator comprises a current source referenced to a fixed voltage.

30. The circuit of claim 26 implemented as an integrated circuit.

31. A method of sensing both positive and negative polarity sense signals in a comparator having a sense input and a control output, comprising:
   coupling said positive or negative sense signal to said sense input;
   configuring said comparator with a systematic offset for providing a switching threshold;
   configuring a bias generator, coupled to said comparator for generating a bias value for defining said systematic offset, configured of at least one semiconductor device occupying a unit area of a substrate; and
   providing a control signal from said control output when the absolute value of said sense signal exceeds said systematic offset.

32. The method of claim 31, comprising: constructing first and second active loads according to a scaling ratio for relating the device area of said active loads to said unit area, to provide, respectively, first and second outputs.

33. The method of claim 32, comprising: setting said scaling ratio by dividing the semiconductor device area of each of said active loads by said unit area.

34. The method of claim 33, comprising: defining said systematic offset corresponding to values of said scaling ratio between zero and two.

35. The method of claim 32, said providing step comprising: generating a control signal from said control output whenever either of said first and second outputs of said comparator exceeds said systematic offset.

36. The method of claim 31, comprising: constructing said comparator in an integrated circuit.

* * * * *